US005986289A

United States Patent [19]

Simmonet

[11] Patent Number: 5,986,289

[45] Date of Patent: Nov. 16, 1999

[54] SURFACE BREAKDOWN BIDIRECTIONAL BREAKOVER PROTECTION COMPONENT

[75] Inventor: Jean-Michel Simmonet, Tours, France

[73] Assignee: SGS-Thomson Microelectronics S.A., Saint Genis, France

[21] Appl. No.: 08/936,590

[22] Filed: Sep. 24, 1997

[30] Foreign Application Priority Data

Sep. 25, 1996 [FR] France .................................. 96 11901

[51] Int. Cl.[6] .................................................. H01C 29/74

[52] U.S. Cl. ............................................ 257/109; 257/111

[58] Field of Search ..................................... 257/109–112

[56] References Cited

U.S. PATENT DOCUMENTS

| | | | |
|---|---|---|---|
| 4,613,884 | 9/1986 | Angerstein et al. | 357/39 |
| 4,797,720 | 1/1989 | Lindner et al. | 357/39 |
| 4,825,266 | 4/1989 | Whight | 357/13 |
| 4,967,256 | 10/1990 | Pathak et al. | 357/38 |
| 5,828,089 | 10/1998 | Bernier | 257/355 |

OTHER PUBLICATIONS

French Search Report from French Patent Application 96 11901, filed Sep. 25, 1996.

RCA Technical Notes, No. 1343, Mar. 1984, Princeton, US, pp. 1–6, J. M. S. Neilson, et al., “Avalanche Diode Structure”.

*Primary Examiner*—David B. Hardy
*Attorney, Agent, or Firm*—Wolf, Greenfield & Sacks, P.C.

[57] ABSTRACT

The present invention relates to a bidirectional breakover component including a lightly-doped N-type substrate, an upper P-type region extending over practically the entire upper surface of the component except its circumference, a lower P-type uniform layer on the lower surface side of the component, substantially complementary N-type regions respectively formed in the upper region and in the lower layer, a peripheral P-type well, an overdoped P-type region at the upper surface of the well, and lightly-doped N-type regions between the circumference of the upper region and the well.

18 Claims, 2 Drawing Sheets

SURFACE BREAKDOWN BIDIRECTIONAL BREAKOVER PROTECTION COMPONENT

BACKGROUND OF THE INVENTION

1. Field of the Invention

The present invention relates to breakover protection components, currently called Shockley diodes or gateless thyristors, of bidirectional type.

2. Discussion of the Related Art

The diagram of a bidirectional Shockley diode appears in FIG. 1. A first Shockley diode S1 and a second Shockley diode S2 are connected in antiparallel between terminals A1 and A2.

FIG. 2 is a simplified cross-sectional view of a semiconductor component conventionally constituting a bidirectional Shockley diode.

The component is constructed on a very lightly-doped N-type substrate 1 and includes on its upper and lower surface sides P-type regions 3 and 4 occupying the major part of the component surface. Each of regions 3 and 4 contains, in a substantially complementary way, an N-type region, respectively 6 and 7. Substantially facing each of regions 6 and 7, at the interface between the respective P region and the substrate, are disposed lightly-doped N-type regions 8 and 9. The upper and lower circumferences of the substrate are surrounded with a highly-doped N-type ring, respectively 11 and 12. The circumferences of the upper and lower surfaces are coated with insulating layers, currently in silicon oxide, respectively 14 and 15. An upper metallization M1 corresponding to electrode A1 covers regions 3 and 6 and a lower metallization M2 covers regions 4 and 7. These metallizations stop on the peripheral oxide layer, respectively 14, 15.

A first vertical Shockley diode, the anode of which corresponds to the upper surface, includes regions 3-1-9-4-7. A second Shockley diode, the cathode of which corresponds to the upper surface, includes regions 6-3-8-1-4. For each of these diodes, the interface (3-8; 4-9) between the internal P-type region and the corresponding lightly-doped N-type region determines the breakdown voltage.

Generally, the lower surface of the component is intended to be mounted by brazing on a base plate forming a thermal distributor. In the case of the component shown in FIG. 2, this base plate 20 must exhibit a surface smaller than the surface of the component and of lower surface metallization M2. Indeed, when the component is mounted on this plate by a brazing layer 21, the brazing tends to overflow laterally to form pads 22. Should metallization M2 extend on the entire lower surface of the component and plate 20 be wider than the component, the brazing pad would overflow on the lateral surface of the component and short-circuit regions 4 and 7 with substrate 1. The function of the component would no longer be ensured, or would be very degraded.

Thus, a tendency of actual technology, for simplifying the assembly, is to implement so-called well components, that is, components having on their entire circumference a region of the same type of doping as one of the lower surface layers. Thus, a short circuit between the lower surface and the lateral surface no longer hinders the operation of the component.

The transformation of the component of FIG. 2 into a well component is illustrated in FIG. 3. Well 31 is formed by P-type drive-ins extending from lower and upper surfaces and joining lower surface P-type region 4. It should be noted that, in this case, the transition from the simple structure of FIG. 2 to the well structure of FIG. 3 is relatively direct. In particular, the disposition of regions 8 and 9 determining the breakdown voltages of the component is not altered.

As shown in FIG. 3, the component can be mounted on a thermal distributor plate 33 which is wider than the component and a possible brazing pad 35 will not affect the operation of the component since it joins a region of the same type of doping as the useful regions which are desired to be connected by lower surface metallization M2.

FIG. 4 shows a simplified cross-sectional view of another embodiment according to the prior art of a double Shockley diode. The component is again formed based on a substrate 1, including upper and lower P-type regions 3 and 4 wherein are formed upper and lower N-type regions 6 and 7. Lightly-doped N-type regions 8 and 9 at the interface between the P-type regions and the substrate are replaced with lightly-doped N-type lateral regions 41 and 42. This disposition enables reaching of a breakdown voltage lower than that of FIG. 2. Indeed, the breakdown voltage depends on the doping gradient at the junction likely to break down. In the case of FIG. 2, the bottom of a P diffusion, that is, a relatively lightly-doped region is located at this junction. Conversely, in the case of FIG. 4, the upper part of the P diffusion (3 or 4) is in contact with $N^-$ region 41 or 42. As a result, lower breakdown voltages can be obtained, which is desired for some applications.

However, the component of FIG. 4 has the same assembling disadvantages as that shown in FIG. 2.

SUMMARY OF THE INVENTION

An object of the present invention is to provide a protection component of double Shockley diode type having a surface breakdown characteristic like the component described in relation with FIG. 4 and which can have a well structure to simplify its assembly.

While the transformation of the component of FIG. 2 into that of FIG. 3 seemed relatively simple, there exists a priori no simple way of transforming the component of FIG. 4 into a well structure. Thus, the present invention provides for significantly modifying the structure of this component.

More specifically, the present invention provides a bidirectional breakover component including a lightly-doped N-type substrate, an upper P-type region extending over practically the entire upper surface of the component except its circumference, a lower P-type uniform layer on the lower surface side of the component, substantially complementary N-type regions respectively formed in the upper region and in the lower layer, a peripheral P-type well; an overdoped P-type region at the upper surface of the well, and lightly-doped N-type regions between the circumference of the upper region and the well.

According to an embodiment of the present invention, the overdoped P-type region has the same level of doping as the upper region.

According to an embodiment of the present invention, the lightly-doped N-type regions have the same level of doping as the substantially complementary N-type regions.

These objects, characteristics and advantages as well as others, of the present invention, will be discussed in detail in the following non-limiting description of specific embodiments of the present invention, in relation with the accompanying drawings.

DETAILED DESCRIPTION

Figure 5:
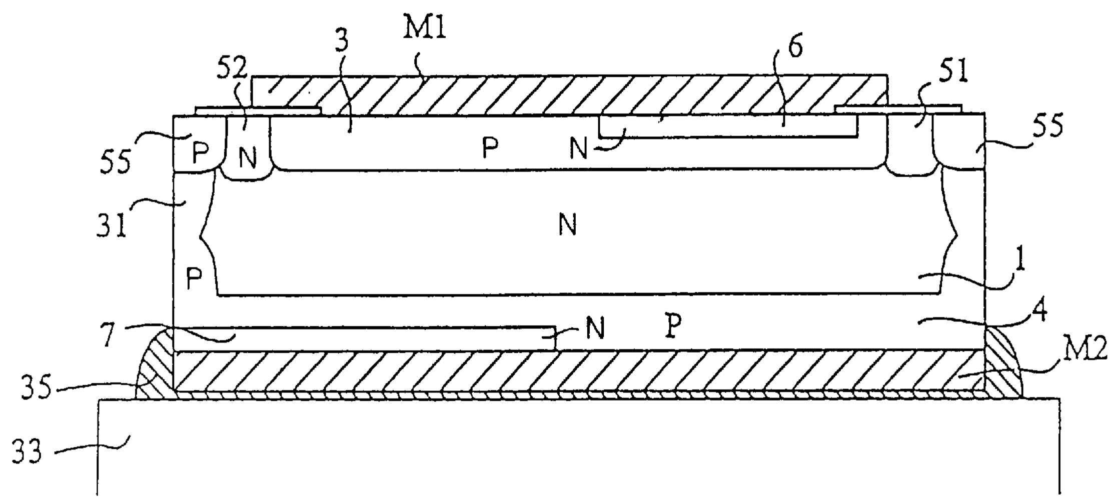
FIG. 5 shows a cross-sectional view of an example of embodiment of a double Shockley diode according to the present invention.

As shown in FIG. 5, the component according to the present invention is formed from a very lightly-doped N-type substrate 1. On the upper surface side and on most of its surface is formed a P-type region 3. On the lower surface side and on its entire surface is formed a P-type region 4. Substantially complementary N-type regions 6 and 7 are formed in respective regions 3 and 4. The component circumference is surrounded with a P-type well 31 formed by drive-in from the upper and lower surfaces.

Between substantially opposite peripheral areas of region 3 and peripheral well 31 are formed lightly-doped N-type regions 51 and 52. A continuous ring can also be formed instead of two distinct regions. It is however preferred to form distinct regions to improve the characteristics of the components and reduce their capacitance.

Besides, the upper surface of the well, especially at locations in contact with regions 51 and 52, is coated with a P-type ring 55 of the same type as region 3 and, preferably, of the same level of doping.

Figure 1:
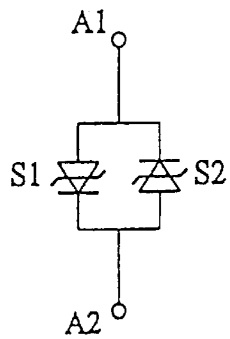
FIG. 1 shows the diagram of a double Shockley diode.
Figure 2:
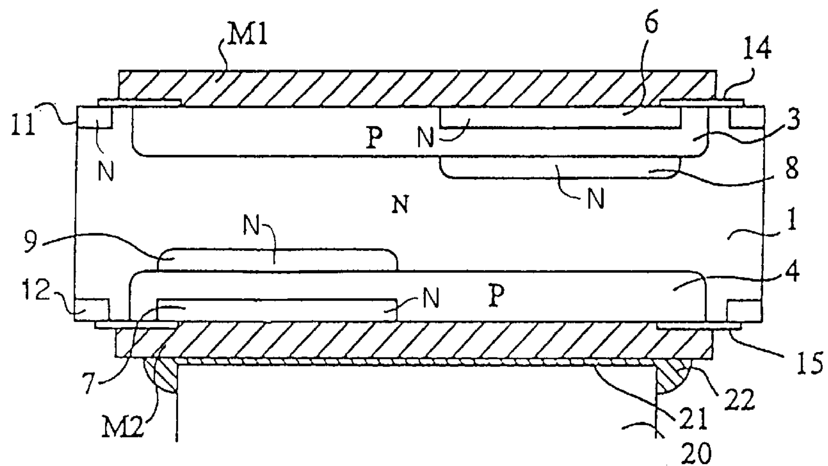
FIGS. 2 to 4 show cross-sectional views of several structures of double Shockley diodes according to prior art.
Figure 3:
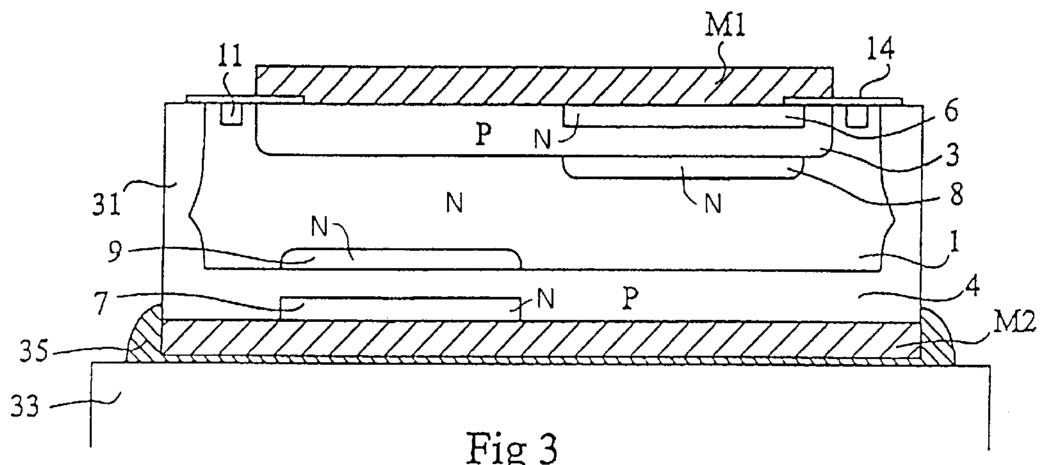

Metallizations M1 and M2 are arranged like in the case of FIG. 3 and enable the same type of assembly on a large dimension base 33.

Figure 4:
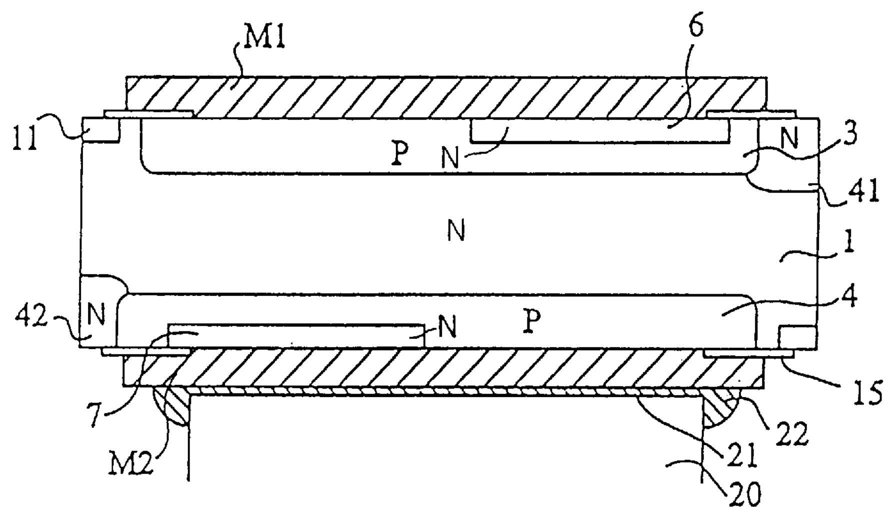

The operating mode of the device of FIG. 5 is not exactly the same as that of FIG. 4, at least during its initial operating phase.

In case of a positive overvoltage on the upper metallization, the current flows from region 3 into region 52 through forward junction 3-52 and then, by avalanche, through the junction between regions 52 and 55. Then, the current circuit flows through well 31 and lower surface 4 towards metallization M2. After which, forward junction PN between regions 4 and 7 becomes conductive and thyristor 3-1-4-7 triggers.

Conversely, when a positive overvoltage appears on the lower metallization, it passes through well 31 to region 55, through the forward junction between regions 55 and 51, and then through the avalanche junction between regions 51 and 3 towards metallization M1, after which the forward junction between regions 3 and 6 becomes conductive and thyristor 4-1-3-6 enters conduction.

Thus, in the case of a positive overvoltage on metallization M1, junction 52-55 determines the avalanche threshold whereas, in the case of a positive overvoltage on metallization M2, junction 51-3 determines the avalanche threshold. This is why a peripheral region 55 of same level of doping as region 3 has been provided to ensure the symmetry of the device. It should be noted that this constitutes a simple way of implementing a double Shockley diode with a distinct breakdown threshold in the two directions by choosing for region 55 a level of doping different from that of region 3.

The structure of FIG. 5 achieves at least the objects aimed at, that is, making a surface breakdown double Shockley diode with a well. This structure is particularly simple. Especially, with respect to the various prior art structures, it includes lightly-doped N-type regions (51, 52) on one surface of the component only, which simplifies the fabrication.

In an embodiment of the present invention, the component of FIG. 5 has been made by using the following fabrication sequence:

diffusion of well 31, simultaneous diffusion of P regions 3, 4, and 55, diffusion of N regions 51 and 52 (this step could be performed before the previous step), diffusion of N regions 6 and 7, opening of the oxide and metallization layers.

It should be noted that, in a certain range of breakdown voltages, regions 51 and 52 could be formed at the same time as regions 6 and 7, which further simplifies the fabrication process.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional breakover component, including:

a lightly-doped N-type substrate;

an upper P-type region extending over practically an entire upper surface of the component except its circumference;

a lower P-type uniform layer on a lower surface side of the component;

substantially complementary N-type regions respectively formed in the upper region and in the lower layer;

a peripheral P-type well, the upper surface of the well being coated with a P-type ring which is more highly doped than the well; and lightly-doped N-type regions between and contacting both the circumference of the upper region and the well.

2. A component according to claim 1, wherein the P-type ring has the same level of doping as the upper region.

3. A component according to claim 1, wherein the lightly-doped N-type regions have the same level of doping as the substantially complementary N-type regions.

4. A component according to claim 1, wherein the N-type regions are more highly doped than the N-type substrate.

5. A Shockley diode device comprising: a substrate of a first conductivity type; an upper region above the substrate and of a second conductivity type; a lower layer below the substrate and also of a second conductivity type; complementary regions respectively formed in said upper region and said lower layer and both of first conductivity type; a peripheral well of a second conductivity type; a first region at an upper surface of the well and of a second conductivity type; and a second region disposed between and contacting both said first region and said upper region, the second region being of the first conductivity type.

6. A device according to claim 5 wherein said first conductivity type is N-type and said second conductivity type is P-type.

7. A device according to claim 5 wherein the first region has the same level of doping as the upper region.

8. A device according to claim 5 wherein the second region has the same level of doping as the complementary regions.

9. A device according to claim 5 wherein said substrate has a lower level of doping than the second region.

10. A device according to claim 9 wherein said substrate is of N-type.

11. A device according to claim 5 wherein said upper region extends over practically an entire upper surface of the substrate except at its circumference.

12. A device according to claim 5 wherein said lower layer is a P-type uniform layer.

13. A device according to claim 5 wherein said complimentary regions are separate N-type regions.

14. A device according to claim 13 where in said peripheral well is of P-type.

15. A device according to claim 5 wherein said first region is a region having a higher level of doping than the peripheral well.

16. A device according to claim 15 wherein said first region is a P-type region.

17. A device according to claim 5 wherein said second region comprises lightly-doped N-type regions.

18. A device according to claim 5 wherein said first region comprises a ring.

* * * * *